United States Patent [19]

Hernandez et al.

[11] Patent Number: 5,925,499
[45] Date of Patent: *Jul. 20, 1999

[54] EPOXY-CONTAINING WATERBORNE PHOTOIMAGEABLE COMPOSITION

[75] Inventors: Maria Elena Hernandez, Aliso Viejo; Shawn Lien, Cypress; Patrick Sean McDevitt, Garden Grove, all of Calif.

[73] Assignee: Morton International, Inc., Chicago, Ill.

[*] Notice: This patent issued on a continued prosecution application filed under 37 CFR 1.53(d), and is subject to the twenty year patent term provisions of 35 U.S.C. 154(a)(2).

[21] Appl. No.: 08/509,887

[22] Filed: Aug. 1, 1995

Related U.S. Application Data

[51] Int. Cl.$^6$ .................................................. G03C 1/725
[52] U.S. Cl. ........................... 430/280.1; 430/288.1; 430/910; 522/85
[58] Field of Search ............................. 430/280.1, 288.1, 430/910; 522/85

[56] References Cited

U.S. PATENT DOCUMENTS

| | | | |
|---|---|---|---|
| 3,929,743 | 12/1975 | Sramek | 260/80.8 |
| 4,092,443 | 5/1978 | Green | 427/53 |
| 5,045,435 | 9/1991 | Adams et al. | 430/288 |
| 5,229,252 | 7/1993 | Flynn et al. | 430/280 |
| 5,364,736 | 11/1994 | Eramo, Jr. et al. | 430/280 |
| 5,364,737 | 11/1994 | Barr | 430/281 |
| 5,387,494 | 2/1995 | Barr et al. | 430/281 |
| 5,389,495 | 2/1995 | Barr | 430/281 |
| 5,393,643 | 2/1995 | Lundy et al. | 430/281 |
| 5,411,837 | 5/1995 | Bottomley et al. | 430/281 |
| 5,439,779 | 8/1995 | Day et al. | 430/280 |
| 5,458,921 | 10/1995 | Briguglio et al. | 427/385.5 |
| 5,501,942 | 3/1996 | Salvin et al. | 430/280.1 |

FOREIGN PATENT DOCUMENTS

| | | | |
|---|---|---|---|
| 0493317 | 7/1992 | European Pat. Off. | 430/280.1 |
| 0666504 | 8/1995 | European Pat. Off. | 430/280.1 |
| 8905476 | 6/1989 | WIPO | 430/280.1 |
| 9524674 | 9/1995 | WIPO | 430/280.1 |

OTHER PUBLICATIONS

Grant, "Hackh's Chemical Dictionary", pp. 240 and 380, Dec. 1969.

"Screen Printing Plate Preparation", *Derwent Publications Ltd.*, London GB, Section Ch, Week 8112, (Kansai Paint KK) Jan., 1981.

*Primary Examiner*—Nam Nguyen
*Assistant Examiner*—Steven H. VerSteeg
*Attorney, Agent, or Firm*—Wayne E. Nacker; Charles N. Lovell; Gerald K. White

[57] ABSTRACT

A waterborne photoimageable composition, developable in alkaline aqueous solution, which is hardenable to form a hard, permanent layer suitable as a solder mask, comprises A) between about 25 and about 40 wt % of a latex acrylic binder polymer having an acid number between about 125 and about 200 and a number average molecular weight of between about 20,000 and about 80,000, B) between about 13 and about 30 wt % of a waterborne epoxy resin having an epoxy equivalent weight of between about 100 and about 700, C) between about 20 and about 35 wt % of photopolymerizable, multi-functional α,β-ethylenically unsaturated monomer and/or short-chain oligomer having a molecular weight between about 500 and about 2000, D) between about 4 and about 20 wt % of a free-radical generating chemical system, E) between about 0.5 and about 10 wt % of an epoxy curative and/or cure catalyst, and F) between about 3 and about 12 wt % surfactant(s), the weight percentages being based on total weight of A)–F).

1 Claim, No Drawings

EPOXY-CONTAINING WATERBORNE PHOTOIMAGEABLE COMPOSITION

The present invention is directed to photoimageable compositions which are waterborne, alkaline aqueous developable, and hardenable so as to form a permanent mask, such as a solder mask on a printed circuit board.

BACKGROUND OF THE INVENTION

Photoimageable compositions useful as resists for forming printed circuits, printing plates, solder masks or the like have been used for some time now. The earliest photoresists were solvent-borne and solvent-developable. The development of aqueous-developable resists represented an advance in reducing solvent emissions in the immediate workplace and in the general environment. The continued emphasis in reducing organic solvent both from the workplace and from the general environment has spurred the search for waterborne photoresists which are formulated and applied as aqueous liquids. U.S. Pat. No. 5,045,435, the teachings of which are incorporated herein by reference, describes a waterborne photoresist composition which is developable in alkaline aqueous solution. The photoimageable composition described in U.S. Pat. No. 5,045,435 is a primary resist used to form a printed circuit board. After a primary resist has served its purpose in forming the printed circuit board, it is stripped from the board.

Resists are also known which are intended to form a hard, permanent layer on a printed circuit board or the like, for example, a solder mask. A solder mask must be hard, durable, and resistant to chemicals, such as organic solvents and strong acids and bases. In this regard a solder mask should meet the standards of IPC/ANSI SM-840B Table 12 tests, Summary of Criteria for Qualification/Conformance (Institute for Interconnecting Circuits). Herein, a solder mask is defined as a layer which meets those tests. Examples of solder mask-forming compositions that are developable in alkaline aqueous solutions are U.S. Pat. Nos. 5,229,252 and 5,364,736, the teachings of each of which are incorporated herein by reference.

It would be further desirable to have a photoimageable composition useful for forming a permanent layer, such as a solder mask, which is waterborne, thereby eliminating or substantially eliminating organic solvents at the point of application.

SUMMARY OF THE INVENTION

In accordance with the invention there is provided a waterborne photoimageable composition, developable in alkaline aqueous solution, which is hardenable to form a hard, permanent layer suitable as a solder mask, the composition comprising A) between about 25 and about 40 wt % of a latex acrylic binder polymer having an acid number between about 125 and about 200 and a number average molecular weight of between about 20,000 and about 80,000, B) between about 13 and about 30 wt % of a waterborne epoxy resin having an epoxy equivalent weight of between about 100 and about 700, C) between about 20 and about 35 wt % of photopolymerizable, multi-functional $\alpha,\beta$-ethylenically unsaturated monomer and/or short-chain oligomer having a molecular weight of between about 500 and about 2000, D) between about 4 and about 20 wt % of a free-radical generating chemical system, E) between about 0.5 and about 10 wt % of an epoxy curative and/or cure catalyst, and F) between about 3 and about 12 wt % surfactant(s), the weight percentages being based on total weight of A)–F).

DETAILED DESCRIPTION OF CERTAIN PREFERRED EMBODIMENTS

Latex binder polymers (A) useful in the photoimageable composition of the present invention are typically prepared by emulsion polymerization of $\alpha,\beta$-unsaturated monomers. Sufficient acid functional monomers are used to provide the acid number of between about 125 and about 200. A typical emulsion polymerization procedure and some examples of suitable emulsions are found in U.S. Pat. No. 3,929,743, the teachings of which are incorporated herein by reference. Such acrylic latex binder polymers are typically formed from acrylic and styrene or substituted styrene monomers. Acid functionality, or a part of it, might also be provided by incorporating monomers having other acid functionality, such as sulfonic acid functionality or phosphonic acid functionality.

The binder polymer need not be neutralized. However, the acid functionality of the binder polymer may be neutralized to some degree, i.e., up to about 20%. Neutralization may be with an amine or ammonia.

Some specific examples of suitable acid functional monomers are acrylic acid, methacrylic acid, maleic acid, fumaric acid, citraconic acid, 2-hydroxyethyl acrylolyl phosphate, 2-hydroxypropyl acrylol phosphate, 2-hydroxy-alpha-acryloyl phosphate, etc. One or more of such acid functional monomers may be used to form the binder polymer. The acid functional monomers may be copolymerized with non-acid functional monomers, such as esters of acrylic acids, for example, methyl acrylate, methyl methacrylate, hydroxy ethyl acrylate, butyl methacrylate, octyl acrylate, 2-ethoxy ethyl methacrylate, t-butyl acrylate, 1,5-pentanediol diacrylate, N,N-diethylaminoethyl acrylate, ethylene glycol diacrylate, 1,3-propanediol diacrylate, decamethylene glycol diacrylate, decamethylene glycol dimethacrylate, 1,4-cyclohexanediol diacrylate, 2,2-dimethylol propane diacrylate, glycerol diacrylate, tripropylene glycol diacrylate, glycerol triacrylate, 2,2-di(p-hydroxyphenyl)-propane dimethacrylate, triethylene glycol diacrylate, polyoxyethyl-2-2-di(p-hydroxyphenyl)-propane dimethacrylate, triethylene glycol dimethacrylate, polyoxypropyltrimethylol propane triacrylate, ethylene glycol dimethacrylate, butylene glycol dimethacrylate, 1,3-propanediol dimethacrylate, butylene glycol dimethacrylate, 1,3-propanediol dimethacrylate, 1,2,4-butanethiol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, and 1,4-benzenediol dimethacrylate; styrene and substituted styrene, such as 2-methyl styrene and vinyl toluene and vinyl esters, such as vinyl acrylate and vinyl methacrylate to provide the desired acid number.

To help ensure that the photoimageable composition is contact imageable, i.e., drys to a tack-free state, the glass transition temperature ($T_g$) of the latex binder polymer is preferably at least about 60° C. as measured by Differential Scanning Calorimetry (DSC) @ 20° C./min.

It is found that the molecular weight of the binder polymer and its acid number are important determinants in being able to enable the composition to carry adequate epoxy resin so as to meet solvent-resistance and alkaline-resistance requirements. The number average molecular weight (Mn) should be between about 20,000 and about 80,000; the acid number should be between about 125 and about 200.

The material which imparts the excellent hardness and durability to the coating after development and final curing is the epoxy resin or mixture of epoxy resins. The epoxy resin or resins comprise between about 13 and about 30 wt. % of the total weight of components (a)–(f). A level of at least about 14 wt % is preferred so as to achieve a cross-link density particularly consistent with adequate alkali and solvent-resistance.

A wide variety of epoxy resins are suitable for use in accordance with the present invention. Typically, epoxies of the Bisphenol A, Novalac and phenol cresol types are used. Other suitable epoxy resins are described, for example, in U.S. Pat. No. 4,092,443, the teachings of which are incorporated herein by reference. Cycloaliphatic epoxides, such as those sold under the trade names Cyanacure® UVR-6100 and UVR-6110 by Union Carbide, Danbury, Conn. are also useful. Epoxy resins used in accordance with the invention preferably have epoxide equivalent weights of between 100 and about 700.

Epoxy resins for the waterborne composition of the present invention are in emulsified form. One type of surfactant used to emulsify epoxy resins is branched and linear isopropylamine dodecylbenzene sulfanate surfactants. A suitable commercially available surfactant for emulsifying epoxy resins is an anionic surfactant sold as Abex® JKB by Rhone Poulenc. Commercially available aqueous epoxy resin emulsions are sold for example under the tradenames Shell Chemicals supplies Epi-Rez® epoxy emulsions; Daubert Chemicals supplies Daubond® epoxy emulsions; and Henkel supplies Waterpoxy™ epoxy emulsions.

To produce the image, this negative-acting photoimageable composition contains C) photopolymerizeable multi-functional monomers or low molecular weight oligomers, particularly α,β-ethylenically unsaturated monomers or oligomers, including a substantial portion of multi-functional monomers. Useful monomers include those multi-functional monomers, listed above, used to form the binder polymers. Some particularly suitable multifunctional acrylic monomers, are as tetraethylene glycol diacrylate (TEGDA), trimethylol propane triacrylate (TMPTA), butanediol dimethacrylate (BDDMA) and pentaerythritol triacrylate (PETA). Multi-functional oligomers, such as epoxy-acrylate oligomers, as described in U.S. Pat. No. 5,229,252, the teaching of which are incorporated herein by reference, should have molecular weights between about 500 and about 2000.

To initiate polymerization of the monomers and/or oligomers upon exposure to actinic radiation, the photoimageable composition contains D) an appropriate photoinitiator(s) or photoinitiator chemical system. Suitable photoinitiators include benzoin ethers, benzil ketals, acetophenones, benzophenones and related compounds with amines. Preferred initiators are thioxanthones, e.g., 2-isopropyl thioxanthones, particularly in conjunction with an amine.

After the photoimageable composition of the present invention is exposed to actinic radiation and developed in alkaline aqueous solution, such as 1% sodium carbonate, the epoxy is cured to render the photoimageable layer hard and permanent. Although epoxy resins are self-cross-linking, to obtain a sufficiently rapid cure for practical application, it is necessary to include E) an epoxy curative, i.e., a compound which enters into the cross-linking reaction and/or an epoxy cure catalyst.

Examples of epoxy curatives are anhydrides of multifunctional carboxylic acids and blocked isocyanates, such as ε-caprolactam-blocked isophorone. Examples of epoxy cure catalysts include amines, such as triethylene amine and dicyanodiamide.

The composition of the present invention contains F) between about 3 and about 12 wt % surfactant based on total weight of components A)–F). Some surfactant is introduced by way of its inclusion in the binder polymer and the emulsified epoxy resin. This typically represents between about 2 and about 3 weight percent based upon the total of A)–F). However, it is generally necessary to add additional surfactants as flow modifiers, dewetting agents and defoamers to ensure defect-free coating of the solder mask. Preferred additional surfactant, which typically represents between about 1 and about 9 weight percent based upon the total of A)–F) is a non-ionic surfactant, such as fluoronated alkyl polyoxethylene ethanols; polyether modified polydimethylsiloxane, and alkylphenol ethoxylate, particularly nonylphenol ethoxylate. Some commercially available surfactants are those supplied by BYK Chemie such as BYK 031, BYK 033, BYK 061, BYK 022 and BYK 346; those supplied by 3M such as FC 129, FC 135, FC 170 and FC 430; those supplied by Surfynol such as Surfynol® 75 and Surfynol 104; those supplied by Dow Corning such as DC 29 and DC 65; those supplied by Ultra Additives such as DeeFo® 3000 DeeFo® PI-4 and DeeFoo® 2020 R; those supplied by DrewPlus such as L-405 and those supplied by Tego Chemie, such as Foamex® 3060.

So that the emulsified epoxy resin does not pre-maturely cure, it is generally the case that the composition of the present invention be provided as a two-part composition. The acid-functional binder polymer and the epoxy curative and/or cure catalyst are provided in a part kept separate from the emulsified epoxy until just prior to use. Current practice is that all components except the epoxy resin be in a first part and the emulsified epoxy resin be provided as a second part.

The composition may also contain additional materials, such as pigments and co-solvents, as is conventional in the art. Many compositions of this type are pigmented, typically containing dispersed pigment at levels of up to about 3.0 wt % relative to total weight of A)–F). Also, to promote coalescing of the emulsified micelles upon drying, it is typical to add between about 3.0 and about 14 wt % based on total weight of A)–F) of cosolvents, such as glycol ethers, glycol ether esters or esteralcohols. Some examples are the glycol ether 1-(2-propoxy-1-methylethoxy)-2-propanol, 2-ethylhexyl ether, diethylene glycol propyl ether, and 2,2, 4-trimethyl-1,3-pentanediol monoisobutyrate sold as Texanol®.

A current sequence for forming the non-epoxy part is to prepare with an emulsified binder of molecular weight and acid number as set forth above. To this is added surfactant. Mixed in with this is dispersed pigment. Cosolvents as coalescing agents are added. Separately prepared is a monomer base comprising an organic phase of monomer and/or oligomer, photoinitiator and epoxy curative and/or cure catalyst. The monomer base is added to the aqueous phase and emulsified therewith. It is believed that during this emulsification, the monomer base is incorporated into the micelles of the binder.

Typically the non-epoxy part is about 40 and about 55% solids, the epoxy part about 40 and about 70% solids. Typically, the waterborne composition, when bothe parts are added together is between about 40 and about 60 wt % solids.

The compositions of the present invention are applied in a conventional manner as a liquid compositions directly to a printed circuit board. After coating, the composition is dried to remove water and also to remove volatiles, such as the cosolvent used as coalescing agents. As the photoimageable composition dries, the system coalesces into a continuous film. Drying is preferably carried out at somewhat elevated temperatures, both to hasten removal of the water and other volatiles. Preferably, drying is carried out at a temperature of between about 65 and about 80° C.

Processing is in a conventional manner. In a typical procedure, a photoimageable composition layer formed from a liquid composition, is applied to a printed circuit board. The photoimageable composition layer is exposed to actinic radiation through appropriate artwork. Exposure to actinic radiation polymerizes the monomers or oligomers in the light-exposed areas, resulting in a cross-linked structure that is resistant to developer. Next, the composition is developed in dilute alkaline aqueous solution, such as a 1% sodium carbonate solution. The alkali solution causes salt formation with the acidic groups of the binder polymers, rendering them soluble and removable. After development, the printed circuit board is heated, typically to a temperature of between about 148 and about 160° C. for sufficient time to effect a cure of the epoxy resin and thereby render the layer hard and permanent.

Current formulations are particularly adapted for spray application. Other means of application, such as curtain coating may require higher viscosities. For such purposes, thickeners may be added, such as polyurethane thickeners, as described in U.S. Pat. No. 5,364,737, the teachings of which are incorporated herein by reference.

The Invention will now be described in greater detail by way of specific examples.

EXAMPLES 1 AND 2

Monomer bases I and II, for Examples 1 and 2, respectively are formulated as follows:

| COMPONENT | Wt % |
|---|---|
| MONOMER BASE I | |
| Trimethylol propane triacrylate (TMPTA) (monomer) | 20.0 |
| Tremethylol propane trimethacrylate (TMPTMA) (monomer) | 10.0 |
| Ebecryl 3701 (diacrylate ester of a bisphenol A epoxy resin) (oligomer) | 22.0 |
| Photomer P-4025 (ethoxylated bisphenol A diacrylate) (monomer) | 20.0 |
| Modaflow (flow control agent) | 0.50 |
| Resimene 755 (methylated/butylated melamine) (thermal cross-linking agent) | 12.0 |
| I-907 (photoinitiator) | 08.0 |
| I-651 (photoinitiator) | 02.0 |
| ITX (photoinitiator) | 02.0 |
| 2MZ-Azine (curative/catalyst for epoxy resin) | 03.5 |
| MONOMER BASE II | |
| TMPTA | 30.0 |
| Ebecryl 3701 (diacrylate ester of a bisphenol A epoxy resin) | 11.0 |
| Ebecryl 3201 (oligomer) | 11.0 |
| Photomer P-4025 (ethoxylated bisphenol A diacrylate) | 20.0 |
| Modaflow | 0.50 |
| Resimene 755 (methylated/butylated melamine) | 12.0 |
| I-907 | 08.0 |

| COMPONENT | Wt % |
|---|---|
| I-651 | 02.0 |
| ITX | 02.0 |
| Dicyanamide (CG 1400) (epoxy curative) | 03.5 |

Using the monomer bases of I and II, Part A was prepared with the following components:

| PART A COMPONENT | Wt % |
|---|---|
| Binder* | 63.20 |
| Deionized Water | 6.19 |
| BYK-033 (surfactant) | 0.19 |
| BYK-346 (surfactant) | 1.12 |
| FC-170 (surfactant) | 2.09 |
| Knightsperse (pigment) | 1.33 |
| Texanol solvent | 2.97 |
| Propyl dipropasol solvent | 1.39 |
| DC-65 (surfactant) | 0.05 |
| Monomer base (I or II) | 21.47 |

(total 100 wt %).

Part A has 47% solids by weight.

Part B is an emulsified epoxy resin. Daubert DC9010W55 (55% solids), a diglycidyl ether of bisphenol A with an epoxy equivalent weight (EEW) of 370.

| *Binder | monomer content | (wt %) |
|---|---|---|
| | methyl methacrylate (MMA) | 45.9 |
| | n-butyl acrylate (nBA) | 15.4 |
| | styrene (STY) | 14.5 |
| | methacrylic acid (MAA) | 19.2 |
| | hydroxyethylacrylate (HEMA) | 5.0 |

Molecular wt., number average-80,000, Acid no. 125

Parts A and B were mixed on a 85:15 weight ratio to produce a photoimageable composition in accordance with the present invention at a solids level of 48%.

The photoimageable composition was applied as a wet film via spray coating. To a printed circuit board, 11.0 gm wet coating composition was sprayed per square foot of laminate in order to achieve an approximate film thickness when dry of 1.2 mils dry film thickness on the laminate. The working viscosity of the photoimageable composition during coating was 800 cps at 25° C. The photoimageable composition was dried at 78° C. for 20 minutes and cooled at room temperature. A diazo artwork was placed directly on the film and film was exposed to actinic radiation having a UV energy exposure level of at least 350 mJ/cm$^2$ at the working surface so as to achieve a Stouffer step of 9–12 on a 21 step sensitivity guide. The film was developed in 1% by weight sodium carbonate monohydrate at 105° C. for 40 seconds. The film was then heat cured at 160° C. for 120 min.

EXAMPLES 3–8

Additional binder polymers useful in the present invention are formulated as follows:

EXAMPLE 3

| *Binder | monomer content | (wt %) |
|---|---|---|
| | methyl methacrylate (MMA) | 45.9 |
| | n-butyl acrylate (nBA) | 15.4 |
| | styrene (STY) | 14.5 |
| | methacrylic acid (MAA) | 19.2 |
| | hydroxyethylacrylate (HEMA) | 5.0 |

Molecular wt., number average-40,000, Acid no. 125

EXAMPLE 4

| *Binder | monomer content | (wt %) |
|---|---|---|
| | methyl methacrylate (MMA) | 39.4 |
| | n-butyl acrylate (nBA) | 15.4 |
| | styrene (STY) | 14.5 |
| | methacrylic acid (MAA) | 25.7 |
| | hydroxyethylacrylate (HEMA) | 5.0 |

Molecular wt., number average-40,000, Acid no. 168

EXAMPLE 5

| *Binder | monomer content | (wt %) |
|---|---|---|
| | methyl methacrylate (MMA) | 42.2 |
| | n-butyl acrylate (nBA) | 15.4 |
| | styrene (STY) | 14.5 |
| | methacrylic acid (MAA) | 22.9 |
| | hydroxyethylacrylate (HEMA) | 5.0 |

Molecular wt., number average-40,000, Acid no. 150

EXAMPLE 6

| *Binder | monomer content | (wt %) |
|---|---|---|
| | methyl methacrylate (MMA) | 36.5 |
| | n-butyl acetate (nBA) | 15.4 |
| | styrene (STY) | 14.5 |
| | methacrylic acid (MAA) | 28.6 |
| | hydroxyethylacrylate (HEMA) | 5.0 |

Molecular wt., number average-70,000, Acid no. 186.4

EXAMPLE 7

| *Binder | monomer content | (wt %) |
|---|---|---|
| | methyl methacrylate (MMA) | 45.9 |
| | n-butyl acetate (nBA) | 15.4 |
| | styrene (STY) | 14.5 |
| | methacrylic acid (MAA) | 19.2 |
| | hydroxyethylacrylate (HEMA) | 5.0 |

Molecular wt., number average-24,000, Acid no. 125

EXAMPLE 8

| *Binder | monomer content | (wt %) |
|---|---|---|
| | methyl methacrylate (MMA) | 20.0 |
| | n-butyl acetate (nBA) | 17.0 |
| | styrene (STY) | 40.0 |
| | methacrylic acid (MAA) | 23.0 |

Molecular wt., number average-40,000, Acid no. 150

What is claimed is:

1. A spray formulation composed of first and second parts capable of being mixed together to form a solder mask-forming photoimageable composition consisting of
   A. between about 25 and about 40 wt. % of a latex acrylic binder polymer having an acid number between about 125 and about 200 and a number average molecular weight of between about 20,000 and about 80,000,
   B. between about 13 and about 30 wt. % of an epoxy resin emulsified in aqueous medium, said epoxy resin having an epoxy equivalent weight of between about 100 and about 700,
   C. between about 20 and about 25 wt. % of photopolymerizable, multi-functional $\alpha,\beta$-ethylenically unsaturated monomer and/or short-chain oligomer having a molecular weight between about 500 and about 2000,
   D. between about 4 and about 20 wt. % of a free-radical generating chemical system,
   E. between about 0.5 and about 10 wt. % of an epoxy curative and/or cure catalyst,
   F. between about 3 and 12 wt. % surfactants(s),
   G. up to about 3.0 wt % pigment, and
   H. optionally from between about 3.0 and about 14 wt % of co-solvent, said weight percentages being based on total weight of A–F, each part of said formulation being borne in an aqueous medium, said waterborne epoxy resin B being in said first part and said curative and/or said cure catalyst E along with said binder A being in said second part, said first and second parts remaining distinct until just prior to being applied to a substrate, wherein said first and second parts upon being mixed form a composition developable in alkaline aqueous solution and being curable after development to provide a hard and permanent mask.

* * * * *